US006755665B2

(12) United States Patent
Lu

(10) Patent No.: US 6,755,665 B2
(45) Date of Patent: Jun. 29, 2004

(54) CONNECTOR INSERT FOR AN OUTPUT CONNECTOR TO TRANSMIT SIGNAL

(75) Inventor: Shan-Jui Lu, Taipei Hsien (TW)

(73) Assignee: Lantek Electronics Inc., Taipei Hsien (TW)

( * ) Notice: Subject to any disclaimer, the term of this patent is extended or adjusted under 35 U.S.C. 154(b) by 0 days.

(21) Appl. No.: 10/299,689

(22) Filed: Nov. 20, 2002

(65) Prior Publication Data

US 2004/0014334 A1 Jan. 22, 2004

(30) Foreign Application Priority Data

Jul. 18, 2002 (TW) .................................... 91210971 U

(51) Int. Cl.[7] .......................... H01R 12/00; H05K 1/00
(52) U.S. Cl. .......................... 439/63; 439/578; 439/550
(58) Field of Search ................................ 439/550, 551, 439/578, 63

(56) References Cited

U.S. PATENT DOCUMENTS 2,713,670 A * 7/1955 Koch ........................ 439/551
4,713,024 A * 12/1987 Hatakeyama et al. ....... 439/555
5,413,502 A * 5/1995 Wang ........................ 439/551
6,071,144 A * 6/2000 Tang ......................... 439/426
6,276,970 B1 * 8/2001 Wong ........................ 439/638
6,299,479 B1 * 10/2001 Tang ......................... 439/578
6,450,836 B1 * 9/2002 Youtsey ...................... 439/620
6,595,799 B2 * 7/2003 Yao ........................... 439/578

* cited by examiner

*Primary Examiner*—Michael C. Zarroli
(74) *Attorney, Agent, or Firm*—Troxell Law Office PLLC

(57) ABSTRACT

A connector for signal transmission includes an inner cap, a conductive part and an outer cap. The inner cap is made of hard insulation material with a cylindrical shape, providing a central inner hole, having a small sized fitting post at a front end thereof corresponding a neck hole of an input/output hole in a distributor of a cable television line and having a reduced outer diameter at a rear end thereof so as to form a joint between the front end thereof and the rear end thereof. The conductive part is made of conductive metal, having a shape of pin at an end thereof and having a trumpet opening formed by at least two metal strips at another end thereof. The outer cap is made of hard insulation material with a cylindrical shape too, having a front end thereof being an open end and a rear end thereof being a close end, a central outer hole being provided at the rear end, a fitting chamber being formed therein for communicating with the outer hole and the front end having a wall thickness corresponding to the input/output hole at an inner diameter thereof and the inner cap at an outer diameter thereof, respectively. The conductive part can be inserted into the inner hole with the pin part thereof extending outward the fitting post and an axial exertion can force the outer cap to be sandwiched between the inner wall of the input/output outer cap and the outer wall of the inner cap tightly.

7 Claims, 5 Drawing Sheets

CONNECTOR INSERT FOR AN OUTPUT CONNECTOR TO TRANSMIT SIGNAL

BACKGROUND OF THE INVENTION

1. Field of the Invention

The present invention relates to a connector foe signal transmission and particularly to an improvement of the connector for signal transmission.

2. Description of Related Art

The signal transmission through a connector has been used for years especially in the field of signal distributors for cable television transmission. As shown in FIG. 1, a signal distributor provides an input connector A and a plurality of output connectors B so that the signal can be transmitted to the output connectors B via the input connector. Hence, different cable television users in a building or an apartment can receive the identical signal as well.

In order to achieve the preceding purpose, a conductive part in the connector has to be available for being connected externally so that the conductive part basically has a pin end and a trumpet end or a cylindrical end as shown in FIG. 2 for receiving at least a pin shaped leg. Taking the output connectors B as an example, the outer end of each output connector B has a shape of trumpet or a cylinder for being inserted with the externally connected leg so as to perform signal link.

Because the connector for transmitting signal is a stationary device after being set up and the quality of signal transmission depends upon whether the connector is firmly located or not, the suppliers incessantly develop new connector and are granted patents concerning firm positioning of the connector. Therefore, how to prevent the connector from loosening is a goal with which the connector for signal transmission is pursued. A conventional locating way for the connector shown in FIG. 6(*a*) is by way of external rivet pressing and another conventional locating way shown for the connector shown in FIG. 6(*b*) is by way of an added inversed hook. However, both of the conventional ways are not so good in avoiding detaching from the signal distributor.

SUMMARY OF THE INVENTION

The crux of the present invention is to provide a connector for signal transmission, which includes an inner cap, a conductive part and an outer cap. The inner cap is made of hard insulation material with a cylindrical shape, providing a central inner hole, having a small sized fitting post at a front end thereof corresponding a neck hole of an input/output hole in a distributor of a cable television line and having a reduced outer diameter at a rear end thereof so as to form a joint between the front end thereof and the rear end thereof. The conductive part is made of conductive metal, having a shape of pin at an end thereof and having a trumpet opening formed by at least two metal strips at another end thereof. The outer cap is made of hard insulation material with a cylindrical shape too, having a front end thereof being an open end and a rear end thereof being a close end, a central outer hole being provided at the rear end, a fitting chamber being formed therein for communicating with the outer hole and the front end having a wall thickness corresponding to the input/output hole at an inner diameter thereof and the inner cap at an outer diameter thereof, respectively. The conductive part can be inserted into the inner hole with the pin part thereof extending outward the fitting post and an axial exertion can force the outer cap to be sandwiched between the inner wall of the input/output outer cap and the outer wall of the inner cap tightly.

BRIEF DESCRIPTION OF THE DRAWINGS

The present invention can be more fully understood by reference to the following description and accompanying drawings, in which.

DETAILED DESCRIPTION OF THE PREFERRED EMBODIMENT

Figure 1:
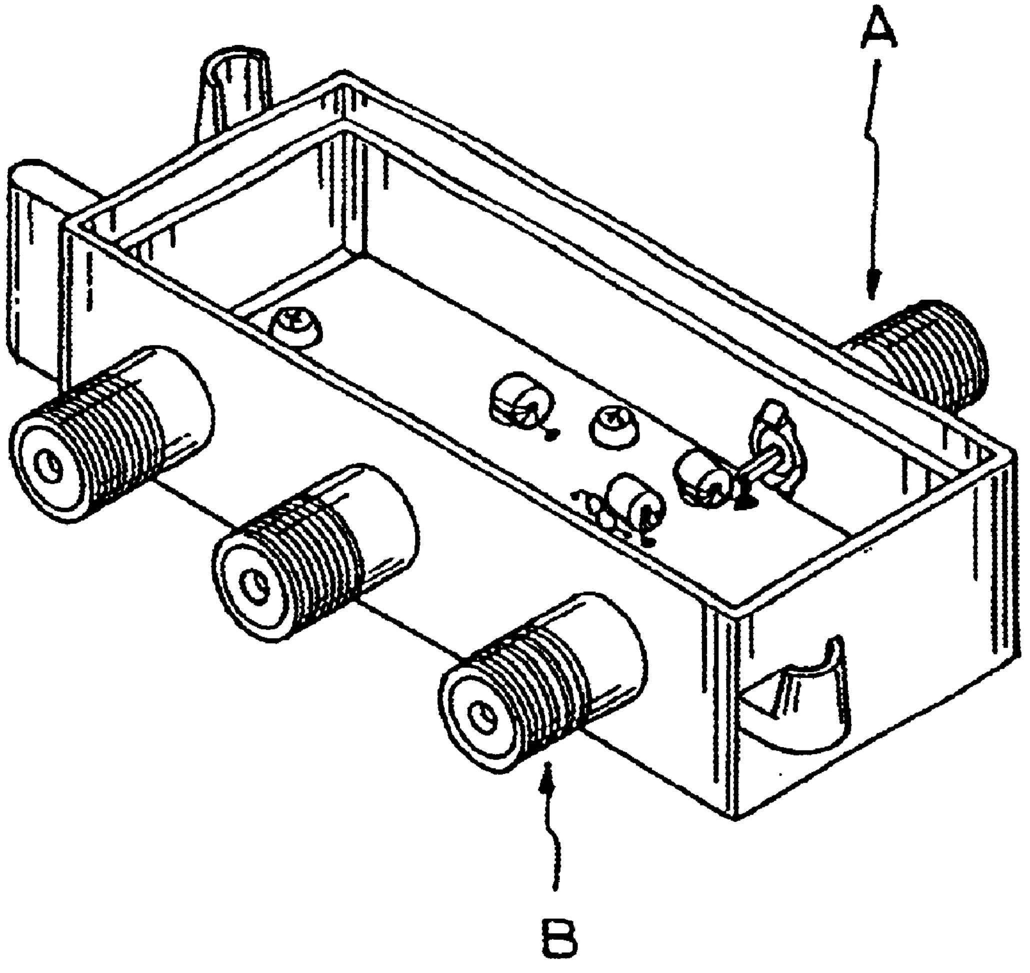
(PRIOR ART) FIG. 1
FIG. 1 is a perspective view of a signal distributor for cable television arrangement.
Figure 2:
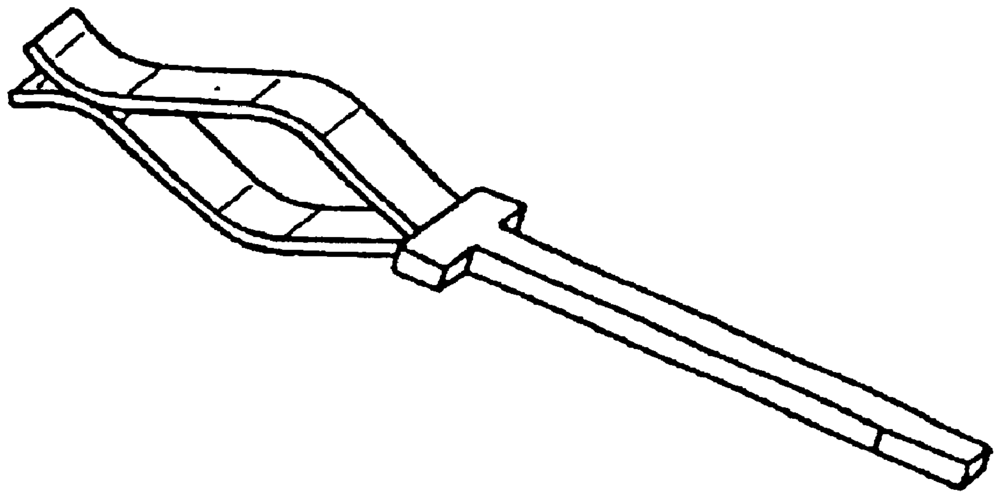
(PRIOR ART) FIG. 2
FIG. 2 is a perspective view of a signal conduction part.
Figure 3:
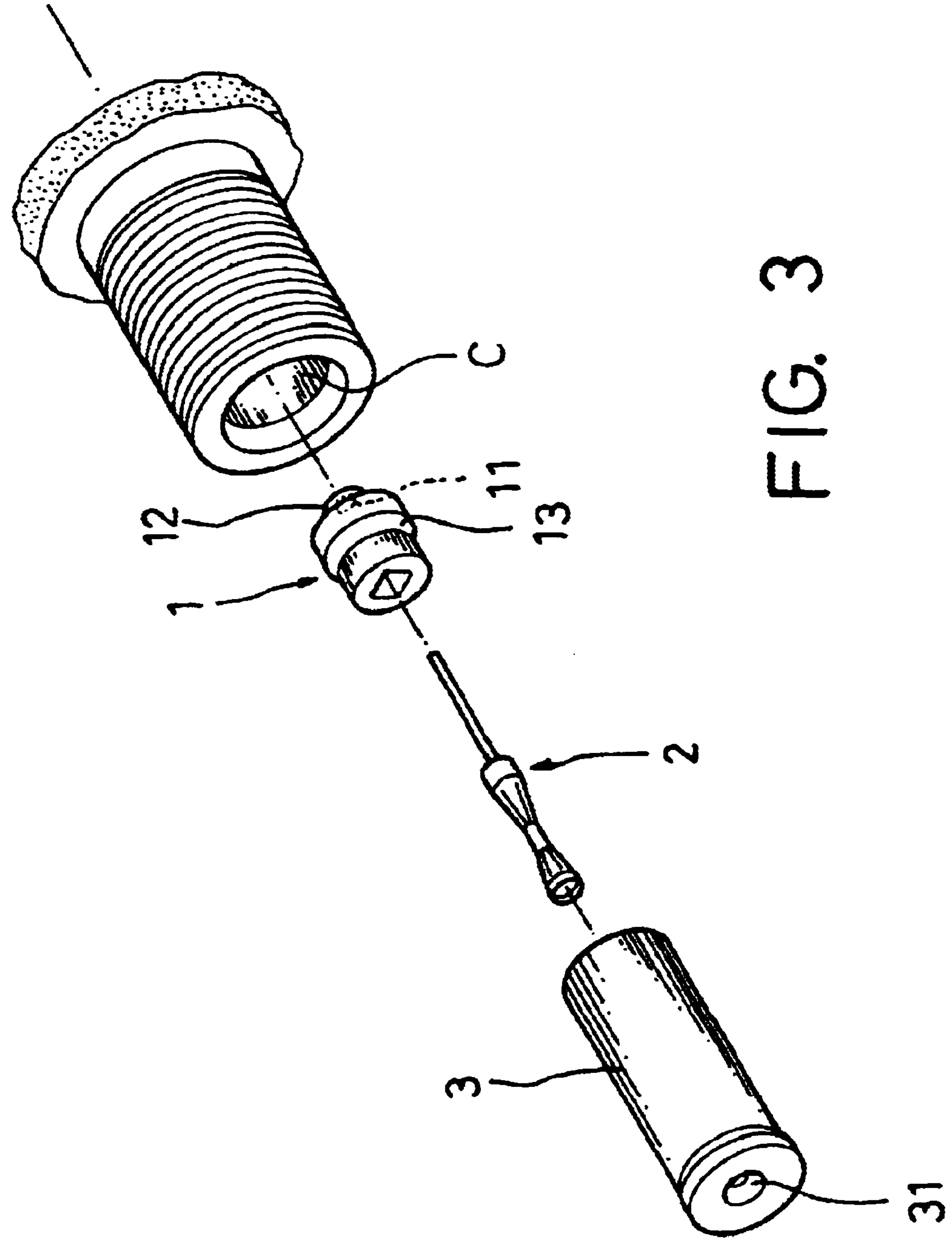
FIG. 3 is an exploded perspective view of a connector for signal transmission according to the present invention.

Referring to FIG. 3, a connector for signal transmission according to the present invention is basically comprised of an inner cap 1, a conductive component 2 and an outer cap 3.

Wherein, the inner cap 1 is made of insulation material such as hard high molecular material with a central inner hole 11 for being passed through with the conductive part 2. The inner cap 1 has an outer diameter thereof a little smaller than the inner diameter of the input/output hole C and has a reduced front end corresponds to a neck hole D of the reduced neck in the input/output hole C to form a fitting post 12 so as to be inserted into the neck hole D after the connector being assembled. Meanwhile, in order to comply with the conductive part 2 in different cross sections, the cross section of the inner hole 11 can be a shape of circle, a square and etc. to correspond to the conductive part 2. In addition, in order to acquire a tight fit for the assembled connector, the inner cap 1 between the front section and the rear section thereof provides a fitting joint 13. The fitting joint 13 can be straight or conical and a conical fitting joint 13 is shown in FIG. 3. Hence, the inner cap at the rear section thereof has a smaller outer diameter than that of the front section thereof with a bigger clearance between the rear section and the input/output hole C.

The conductive part 2 is a conventional component and it is preferable that the conductive part 2 is made of conductive metal such as copper. The conductive part 2 at an end thereof has a shape of pin and the other end thereof has a trumpet opening or a shape of bail formed of two metal strips. Because these are prior art and no detail will be described further. Meanwhile, the pin end thereof has a size corresponding to the inner hole 11 for being inserted easily.

The outer cap 3 has a shape of sleeve with an open end and a close end. A central outer hole 31 is arranged at the close end and it is preferable that the outer hole 31 has a trumpet outlet. As soon as the outer cap 3 is attached to the inner cap 1, a cap chamber 32 is formed therein for receiving the rear end of the conductive part 2. Besides, in order to obtain a state of tight fit, the outer cap 3 at the front end thereof provides a thickness corresponding to the difference between the input/output hole C and the inner cap. Further, the outer cap 3 can be made with a shape of trumpet to correspond to the shape of the end opening in the input/output hole C. But, this is prior art and no detail will be described further.

Figure 4:
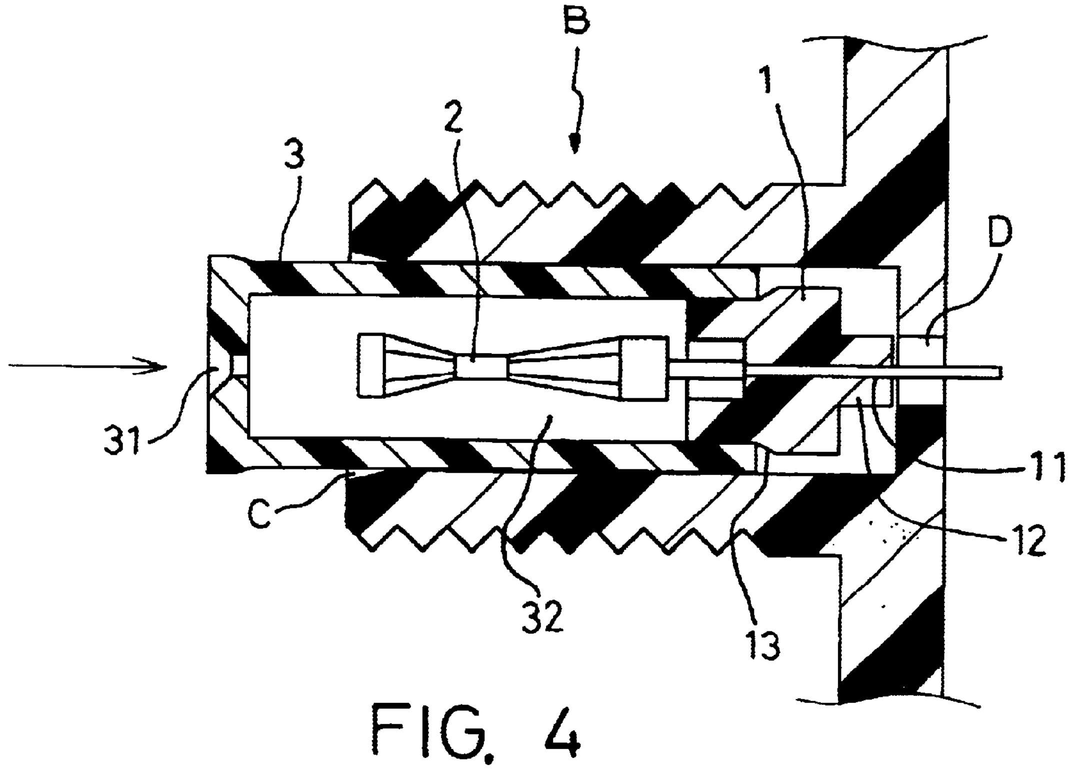
FIG. 4 is a sectional view of the connector of the present invention is disposed in the signal distributor and not being fixed to the signal distributor.
Figure 5:
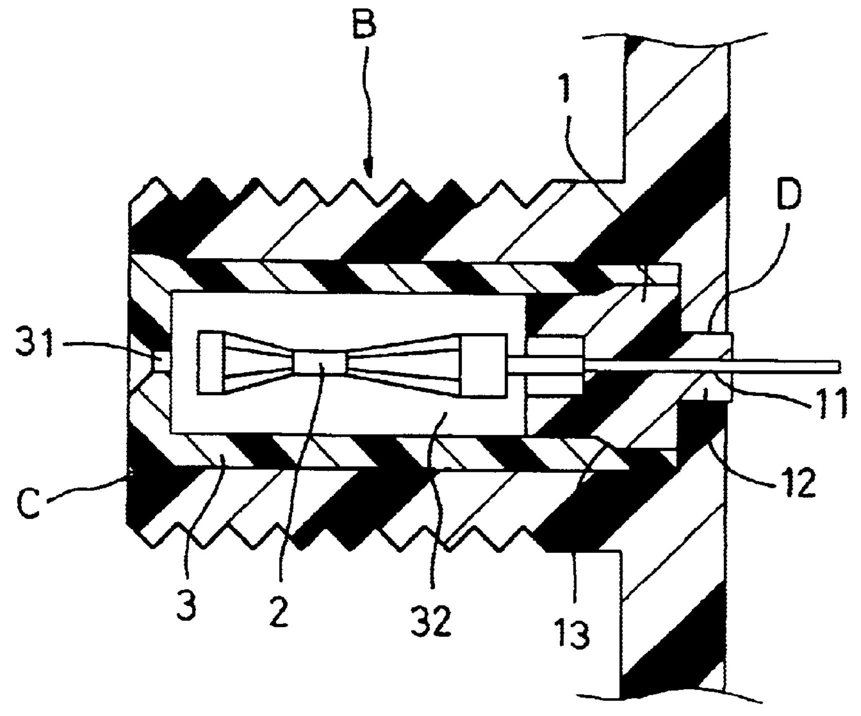
FIG. 5 is a sectional view of the connector of the present invention being disposed in the signal distributor and being fixed to the signal distributor.
Figure 6A:
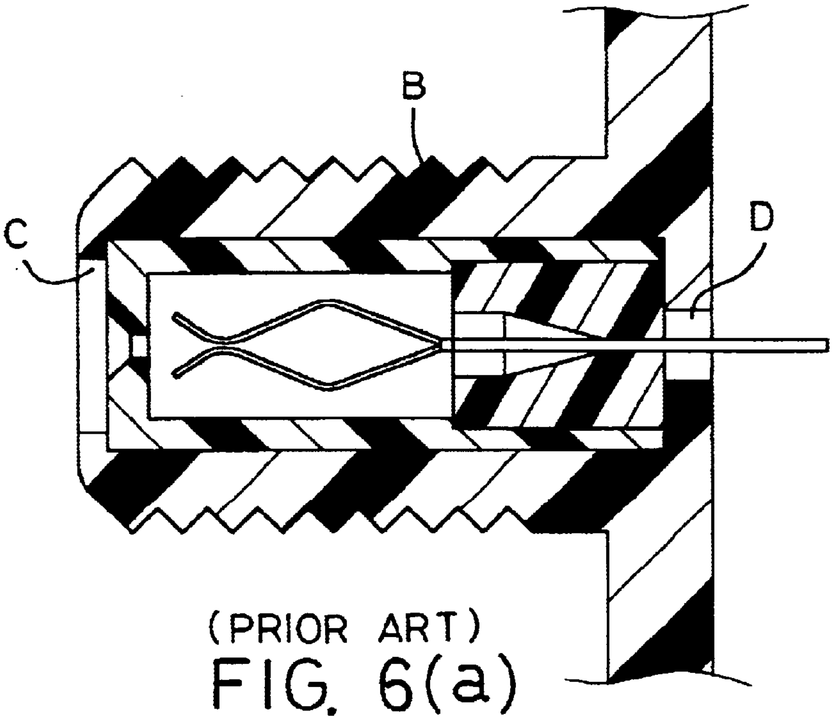
(PRIOR ART) FIG. 6(a)
FIG. 6A is sectional view of a conventional connector being associated with the signal distributor by way of rivet pressing.
Figure 6B:
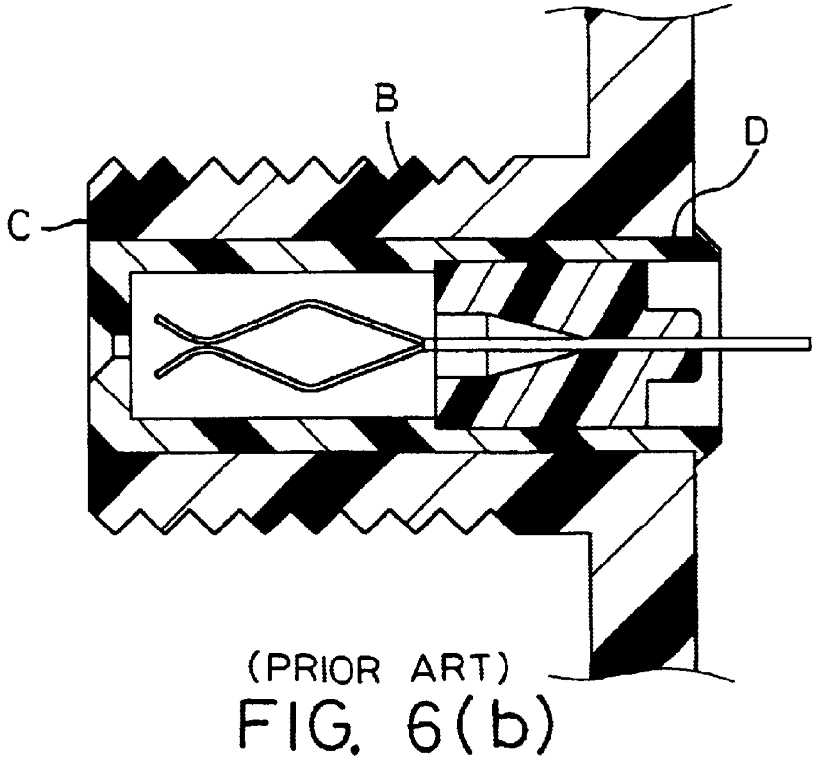
(PRIOR ART) FIG. 6(b)
FIG. 6B is sectional view of a conventional connector being associated with the signal distributor by way of a reversed hook.

Referring to FIG. 4, an end of the conductive part 2 is pierced through and extends outward the inner hole 11 of the inner cap 1 first. Then, the inner cap 1 with the conductive part 2 is inserted into the input/output hole C. Further, the outer cap 3 is inserted into the input/output hole C with the open end thereof being press against the outer wall of the inner cap 1 and the inner wall of the of the input/output hole C. In this way, the fitting post 12 engages with the neck hole D to form a tight fit as shown in FIG. 5 so that the input/output signal can be transmitted by the conductive part 2 via the outer hole 31.

Accordingly, it is appreciated that the connector for signal transmission according to the present invention can convert the axial exerted force into an expanded transverse force so as to result in a tight fit among the open end of the outer cap 3, the inner cap 1 and the input/output hole C. Further, the outer cap 3 can be flush with the outer wall of the input/output hole C after assembling so that no phenomenon such as loosening or moving apart will occur. Moreover, the outer wall of the input/output hole C can be made to extend inward by way of pressing to act as a stopper.

While the invention has been described with reference to the a preferred embodiment thereof, it is to be understood that modifications or variations may be easily made without departing from the spirit of this invention, which is defined by the appended claims.

What is claimed is:

1. A connector insert for an output connector to transmit a signal comprising:

a) an inner cap inserted into an input and output hole of the output connector and having:
   i) a central inner hole;
   ii) a fitting post located on an exterior periphery of a first end thereof and inserted into a neck hole of the output connector; and
   iii) a fitting joint located on the exterior periphery of a middle section thereof;

b) a conductive component having first and second ends, the first end having a pin shape, the second end having a trumpet opening formed by at least two metal strips, the first end inserted through the central inner hole of the inner cap; and c) an outer cap inserted into the input and output hole of the output connector and having:
   i) a central outer hole located in a first end thereof; and
   ii) a cap chamber communicating with the central outer hole and a second end thereof, wherein the inner cap is inserted into the cap chamber from the second end of the outer cap, the outer cap engaging the fitting joint on an interior of the cap chamber and an interior of the input and out put hole on an outer periphery thereof.

2. The connector insert according to claim 1, wherein the inner cap has a cylindrical shape.

3. The connector insert according to claim 1, wherein the outer cap has a cylindrical shape.

4. The connector insert according to claim 1, wherein the fitting joint of the inner cap has a conical shape.

5. The connector insert according to claim 1, wherein the second end of the conductive part has a cone shape.

6. The connector insert according to claim 1, wherein the first end of the outer cap has a cone shape.

7. The connector insert according to claim 1, wherein the central outer hole of the outer cap is trumpet shaped.

* * * * *